United States Patent
Fujisawa

(10) Patent No.: US 7,426,144 B2
(45) Date of Patent: Sep. 16, 2008

(54) SEMICONDUCTOR STORAGE DEVICE

(75) Inventor: Hiroki Fujisawa, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 189 days.

(21) Appl. No.: 11/521,489

(22) Filed: Sep. 15, 2006

(65) Prior Publication Data

US 2007/0076474 A1    Apr. 5, 2007

(30) Foreign Application Priority Data

Sep. 16, 2005    (JP)    ............................ 2005-271197

(51) Int. Cl.
*G11C 7/10*    (2006.01)

(52) U.S. Cl. ............................ 365/189.05; 365/189.02; 365/219; 365/233

(58) Field of Classification Search ............ 365/189.01, 365/189.02, 189.05, 198, 219, 233
See application file for complete search history.

(56) References Cited

U.S. PATENT DOCUMENTS 5,999,458 A * 12/1999 Nishimura et al. ..... 365/189.05

6,914,829 B2 * 7/2005 Lee ..................... 365/189.02

FOREIGN PATENT DOCUMENTS

JP    2001-243770 A    9/2001

* cited by examiner

*Primary Examiner*—VanThu Nguyen
(74) *Attorney, Agent, or Firm*—McDermott Will & Emery LLP

(57) ABSTRACT

A semiconductor storage device comprising: a transfer control circuit for prefetching data of a predetermined number of bits stored in a memory array in response to a read command, and transferring L bits of the prefetched data in parallel to an internal bus in synchronization with an internal clock; and an output buffer circuit which includes L FIFO buffers each for latching each bit of the L bits input from the internal bus and extracts stored data from each of the L FIFO buffers in accordance with an input sequence in synchronization with an external clock so as to transfer the data serially to outside, wherein each of the L FIFO buffers includes an M-bit latch circuit and an N-bit latch circuit, and paths of the M-bit and N-bit latch circuits can be selectively switched.

12 Claims, 12 Drawing Sheets

SEMICONDUCTOR STORAGE DEVICE

BACKGROUND OF THE INVENTION

1. Field of the Invention

This invention relates to a semiconductor storage device which transfers data stored in a memory array to the outside in response to a read command, and particularly relates to a semiconductor storage device having a configuration for prefetching data of a predetermined number of bits to store in a output buffer circuit and transferring the data sequentially from the output buffer circuit to the outside.

2. Related Art

In recent yeas, in order to control systems using semiconductor storage devices such as a DRAM (dynamic random access memories), there is a need for a technology for transferring data to the outside at high speed. For example, a DDR SDRAM (double-data-rate synchronous DRAMs) synchronizes with both rising and falling edges of an external clock to achieve higher-speed data transfer. In general, when data is read from the DRAM, access time from when a read command is issued until read data is output is determined by a predetermined number of cycles of the external clock. The number of cycles of the external clock is preset as CAS (column address strobe) latency, and when the amount of time corresponding to the number of cycles of the CAS latency passes after the read command is received, the read data is transferred to the outside. In recent years, due to rapid advances in speeding up the external clock, there is a tendency that the CAS latency increases.

In general, since speeding up the internal operation of the DRAM is limited, a configuration in which data located at consecutive addresses are read, a predetermined number of bits are prefetched, and the prefetched bits are transferred in parallel to an output buffer circuit and are stored therein is employed in order to adjust the speed of the internal operation and the high speed of transferring data to the outside (e.g., refer to Japanese Unexamined Patent Application Publication No. 2001-243770). For example, control is performed such that prefetched data of a plurality of bits is pre-stored in the output buffer circuit and, when the aforementioned access time arrives, the data is serially transferred in synchronization with the external clock. By this, the external transfer speed can be increased several-fold relative to the internal operation speed.

On the other hand, a burst read operation in which addresses are updated at predetermined intervals and data is continuously read and output in sequence is known as a read operation. When such a burst read operation is performed, at timing when data for which a read command has been previously issued is still stored in the output buffer circuit, data for which a read command is subsequently issued may be further stored therein. Thus, in order to prevent malfunction caused by overwriting of the output buffer circuit, it is necessary to configure the output buffer circuit with multistage FIFO (first in, first-out) buffer and to perform control so that input data is stored during a predetermined time and is sequentially output in accordance with the input sequence.

In general, it is required that access to the DRAM conforms to various operating conditions, including the frequency of the external clock and so on. In this case, the number of stages of the aforementioned FIFO buffer and the value of the CAS latency must be set so as to ensure a proper operation even in the worst operating condition. For example, during the burst read operation, the access time increases as the frequency of the external clock decreases, whereas the timing at which data is transferred to the output buffer circuit comes relatively early. Thus, there is a need to enable the output buffer circuit to reliably store data even in such an operation condition. In contrast, when the frequency of the external clock increases, the timing at which data is transferred to the output buffer circuit is delayed relative to the access time under the same condition. Thus, the amount of data to be stored in the output buffer circuit is essentially small. Accordingly, when configuring the output buffer circuit which conforms the worst operating condition in which the external clock has a wide frequency range, unnecessary circuitry for data storage increases. In this case, particularly when a high-speed external clock is used, the unnecessary circuitry in the output buffer circuit causes problems, such as an increase in the scale of circuitry operating in the output buffer circuit and an increase in the number of control-signal lines. A combination of the factors described above causes a problem in that, particularly, current consumed during high-speed access to the DRAM increases.

BRIEF SUMMARY OF THE INVENTION

An object of the present invention is to provide a semiconductor storage device which enables the number of bits of latch circuits included in the output buffer circuit to be selectively switched when operating conditions change depending on the frequency of the external clock or the like, and can reduce unnecessary circuitry to prevent an increase in consumption current during high-speed access, while ensuring a reliable operation during low-speed access.

An aspect of the present invention is a semiconductor storage device comprising: a transfer control circuit for prefetching data of a predetermined number of bits stored in a memory array in response to a read command, and transferring L bits which is a transfer unit of said prefetched data in parallel to an internal bus in synchronization with an internal clock; and an output buffer circuit which includes L FIFO buffers each for latching each bit of said L bits input from said internal bus and extracts stored data from each of said L FIFO buffers in accordance with an input sequence in synchronization with an external clock so as to transfer said data serially to outside, wherein each of said L FIFO buffers includes an M-bit latch circuit for latching M bits of data input sequentially and an M-bit latch circuit for latching N (N>M) bits of data input sequentially, and a path of said M-bit latch circuit and a path of said N-bit latch circuit can be selectively switched.

According to the semiconductor storage device of the present invention, when a read command is issued, L bits of data prefetched from the memory array is transferred in parallel to the output buffer circuit through the internal bus and is serially transferred to the outside through either the M-bit latch circuit or the N-bit latch circuit. Since the parallel transfer of the L bits through the internal bus shifts to the serial transfer each of 1 bit to the outside, the transfer speed of the internal bus requires only 1/L-th of that of the external transfer speed. In this case, in the output buffer circuit in which the transfer data is stored, the M-bit latch circuit and the N-bit latch circuit can be switched in accordance with operating conditions. Therefore, when using a small scale M-bit latch, it is possible to reduce consumption current during the burst read operation, and when using the N-bit latch circuit capable of storing a larger number of bits, it is possible to reliably prevent malfunction caused by a change in the access time or the like.

In the present invention, said M may be 1 and said M-bit latch circuit may be a 1-bit latch circuit for latching 1 bit of data input sequentially.

In the present invention, the semiconductor storage device may further comprise a determination circuit for generating a determination signal having a binary value based on an access time corresponding to said read command, and said output buffer circuit may switch paths of said M-bit latch circuit and said N-bit latch circuit said in response to said determination signal.

In the present invention, said determination signal may indicate a relationship in value between said access time and a predetermined set value, and said output buffer circuit may switch in response to said determination signal so that the path of said M-bit latch circuit is set when said access time does not reach said set value and the path of said N-bit latch circuit is set when said access time exceeds said set value.

By such a configuration, when the access time is reduced using a high-speed clock, the path of the M-bit circuit having a small circuit scale is set to reduce consumption current, and when the access time is increased using a low-speed clock, the path of the N-bit circuit capable of storing a large amount of data is set to prevent malfunction.

In the present invention, said access time may be specified as a time obtained by multiplying a period of said external clock and a CAS latency.

In the present invention, said determination circuit may generate said determination signal based on said access time corresponding to a first read command after an issuance of a set command for a mode register.

In the present invention, said transfer control circuit may prefetch data of said predetermined number of bits corresponding to a predetermined number of consecutive addresses for a burst read operation.

In the present invention, said transfer control circuit may prefetch data of 2L bits corresponding to 2L consecutive addresses, and said L bits into which said 2L bits is divided may be transferred in parallel to said internal bus.

In the present invention, said L may be 4 and said transfer control circuit may include four said FIFO buffers.

In the present invention, said N may be 6 and said N-bit latch circuit may be a 6-bit latch circuit for latching 6 bits of data input sequentially.

In the present invention, said output buffer circuit may perform said serial transfer in synchronization with a rising edge and a falling edge of said external clock.

In the present invention, a configuration of P bits as I/O bits may be employed and P said transfer control circuits and P said output buffer circuits may be arranged in parallel.

As described above, according to the present invention, a configuration can be realized in which L bits of prefetched data from the memory array is transferred in parallel to the internal bus, each bit of the data is stored in each FIFO buffer, each the stored data is extracted to be transferred serially to the outside in accordance with the input sequence, and each FIFO buffer is capable of switching selectively between paths of the N-bit latch circuit and the M-bit latch circuit. Accordingly, by the control in accordance with operating conditions of the semiconductor storage device, when the path of the M-bit latch circuit having a small circuit scale is selected, consumption current can be reduced, and when the path of the N-bit latch circuit capable of storing large size data is selected, an operating margin can be ensured to prevent malfunction. Further, by generating a determination signal based on the access time, the path of the M-bit latch circuit and the path of the N-bit latch circuit can be automatically switched, and thereby it is possible to achieve an optimum burst read operation.

In this specification, the term "bit" means a unit of prefetched data, and more specifically, means an amount of data to be read from or written to a portion corresponding to one address of a semiconductor storage device.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

An embodiment of the present invention will be described below with reference to the accompanying drawings. A case in which the present invention is applied to a DRAM, which serves as a semiconductor storage device, will be described in this embodiment. The present invention is effectively applied to a DRAM and more particularly to a DDR SDRAM which operates in synchronization with a rising edge and a falling edge of an external clock.

Figure 1:
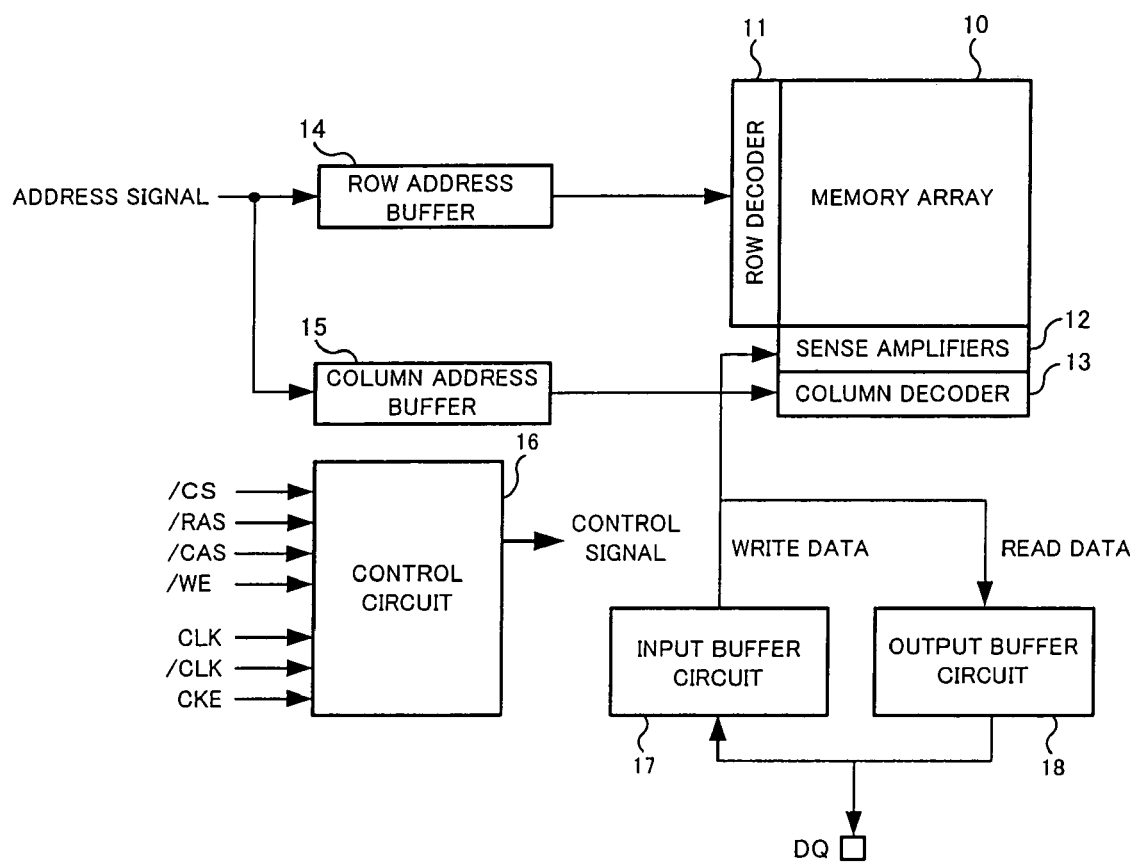
FIG. 1 is a block diagram showing a schematic configuration of the DRAM of the embodiment.

FIG. 1 is a block diagram showing a schematic configuration of the DRAM of this embodiment. The DRAM shown in FIG. 1 includes a memory array 10 for storing data; a row decoder 11, a sense amplifier unit 12 and a column decoder 13 which are provided on the periphery of the memory array 10; a row address buffer 14 and a column address buffer 15 which store addresses; a control circuit 16 for controlling operation of the entire DRAM; and an input buffer circuit 17 and an output buffer circuit 18 which transfer data input/output between the memory array 10 and the outside. In practice, the DRAM of this embodiment is configured to include many other elements; however, only elements associated with the function of the present invention are shown in FIG. 1.

In FIG. 1, the memory array 10 has a plurality of memory cells formed at intersections of word lines and bit lines, which are arranged in a matrix. Memory cells accessed during read/write operation are determined in response to a word line selected by the row decoder 11 and a bit line selected by the column decoder 13. The row address buffer 14 stores a row address corresponding to the word line selected by the row decoder 11 and the column address buffer 15 stores a column address corresponding to the bit line selected by the column decoder 13. The addresses stored in the row address buffer 14 and the column address buffer 15 can be set by an address signal input from the outside.

In response to input external commands, the control circuit 16 sends predetermined control signals to portions of the DRAM to control the operation thereof. Each external command input to the control circuit 16 is defined based on a combination pattern of a /RAS signal, a /CAS signal, a /WE signal and a /CS signal, and the type of external command is determined by a command decoder (not shown) of the control circuit 16. Clocks CLK and /CLK having a predetermined frequency, whose phases are inverted from each other, are input to the control circuit 16 as external clocks. The control circuit 16 controls the operation in synchronization with the rising edge or the falling edge of the clock CLK or /CLK. A control signal CKE is used to switch between valid and invalid states of the clocks CLK and /CLK.

When a write command is input as an external command, data input from the outside through a DQ terminal is sequentially stored to the input buffer circuit 17 and is written to the memory array 10 at a predetermined timing. When a read command is input as an external command, data stored in the memory array 10 is read and amplified by the sense amplifier unit 12. Thereafter, the amplified data is transferred to the output buffer circuit 18 so as to be sequentially latched therein, and is transferred to the outside through the DQ terminal at a predetermined timing. Although not shown in FIG. 1, various circuits and an internal bus required for the transfer operation are provided between the memory array 10 and the input and output buffer circuits 17 and 18.

Figure 2:
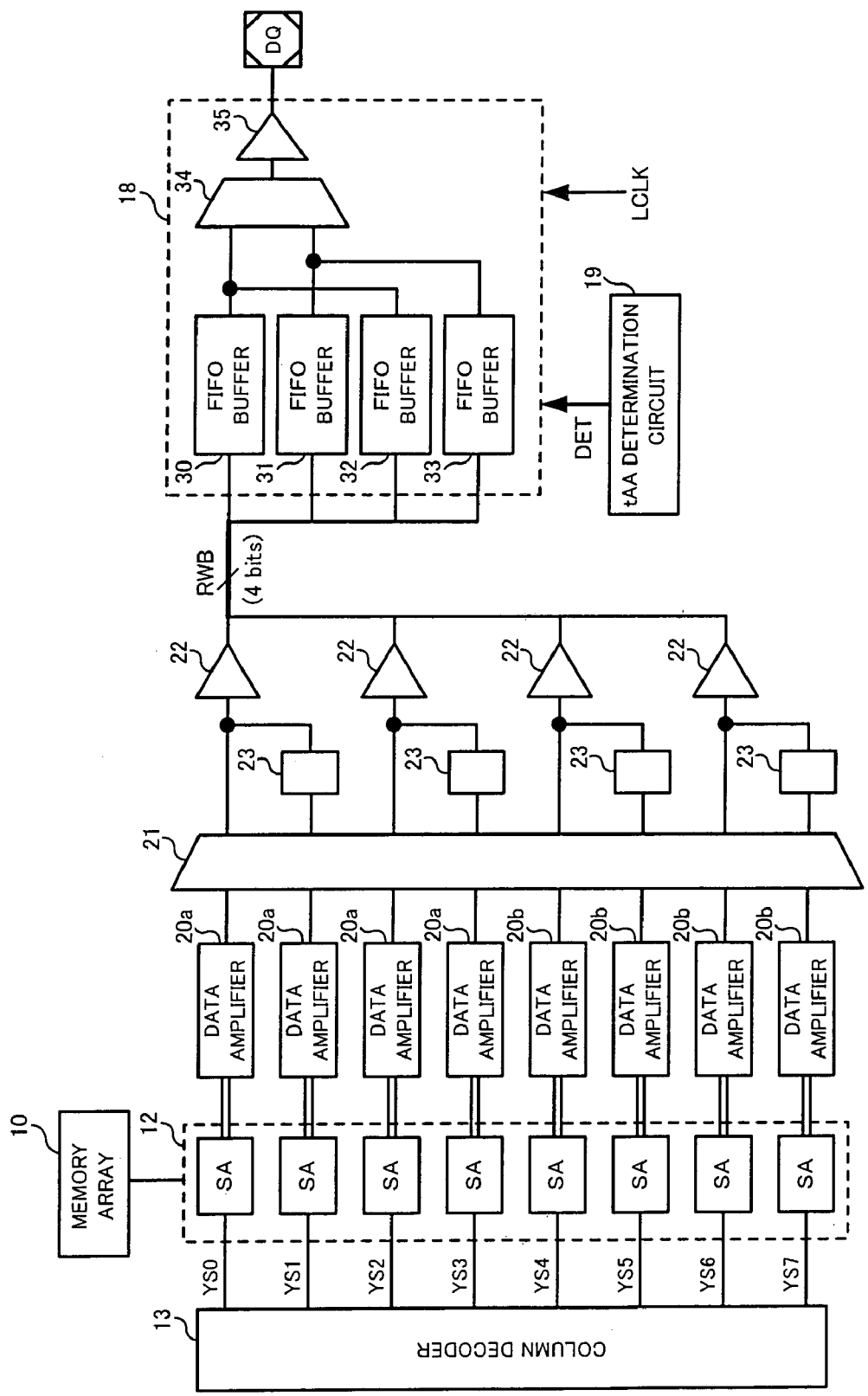
FIG. 2 is a block diagram showing a primary configuration corresponding to a transfer path for transfer data.

Next, a circuit configuration and a transfer operation will be described, in which data is transferred to the outside from the memory array 10 through the output buffer circuit 18 and the DQ terminal. FIG. 2 is a block diagram showing a primary configuration corresponding to a transfer path for data to be read. This embodiment employs a configuration in which, when performing a burst read operation of the memory array 10, data of a plurality of bits corresponding to a plurality of consecutive addresses is prefetched and is transferred in parallel to the output buffer circuit 18 to allow a reduction in the internal transfer speed relative to the high external transfer speed.

In FIG. 2, eight consecutive sense amplifiers SA included in the sense amplifier unit 12 are selected by eight selection signals YS (YS0 to YS7) output from the column decoder 13. 8-bit data read from eight memory cells in the memory array 10 is simultaneously amplified by the eight sense amplifiers SA through complimentary bit line pairs. In this manner, 8-bit prefetch is employed in this embodiment to perform a transfer operation of 8-bit data having eight consecutive addresses.

8-bit data output from the eight sense amplifiers SA is amplified by eight data amplifiers 20a and 20b, which are connected to the respective eight sense amplifiers SA, and thereafter the amplified data is input to a selector 21. In the selector 21, outputs of first-half four data amplifiers 20a are output to four buffers 22 and outputs of second-half four data amplifiers 20b are output to delay units 23. By this, 4-bit data transferred through the data amplifiers 20a and 4-bit data transferred through the data amplifiers 20b are alternately selected, so that the resulting data is sent to a read/write bus RWB through the buffers 22 at different timing for each 4 bits. That is, the prefetched 8-bits are divided into two parts, and the resulting 4 bits are transferred in parallel through the read/write bus RWB. Thus, the transfer operation of the read/write bus RWB is controlled by an internal clock so that its transfer speed is one fourth of the external transfer speed. As described above, in the DRAM, the configuration (shown in FIG. 2) for transferring data in parallel to the read/write bus RWB serves as transfer controlling means of the present invention. Although the read/write bus RWB is used as a data transfer path during both reading and writing, only the data transfer operation during reading will be described in this embodiment.

The 4-bit data transferred in parallel through the read/write bus RWB is input to the output buffer circuit 18. As shown in FIG. 2, the output buffer circuit 18 includes four FIFO buffers 30, 31, 32 and 33, a selector 34, and a buffer 35. Each of the four FIFO buffers 30 to 33 are a circuit for receiving each bit of the four bits transferred in parallel through the read/write bus RWB, storing each bit for a predetermined time, and thereafter extracting each bit in accordance with the input sequence. As described later, each of the FIFO buffers 30 to 33 can be selectively switched between a 1-bit latch circuit and a 6-bit latch circuit. A specific configuration and operation of the FIFO buffers 30 to 33 are described later. The output buffer circuit 18 transfers the transfer data to the outside bit by bit in synchronization with rising and falling edges of a clock LCLK for determining the transfer timing. The clock LCLK has the same frequency as the external clock CLK.

A determination signal DET is supplied from a tAA determination circuit 19 to the output buffer circuit 18. The tAA determination circuit 19 determines an access time tAA for data to be read and generates the determination signal DET having a binary value which indicates whether or not the access time tAA exceeds a predetermined time. The access time tAA defines a time from when a read command with a designated address is issued until the first data corresponding to the address is transferred to the outside, and is generally expressed in terms of the number of cycles of the clock CLK. In the output buffer circuit 18, the 1-bit latch circuit and the 6-bit latch circuit is switched in accordance with the determination signal DET in each of the FIFO buffers 30 to 33. A specific configuration and operation of the tAA determination circuit 19 are described later.

Figure 3:
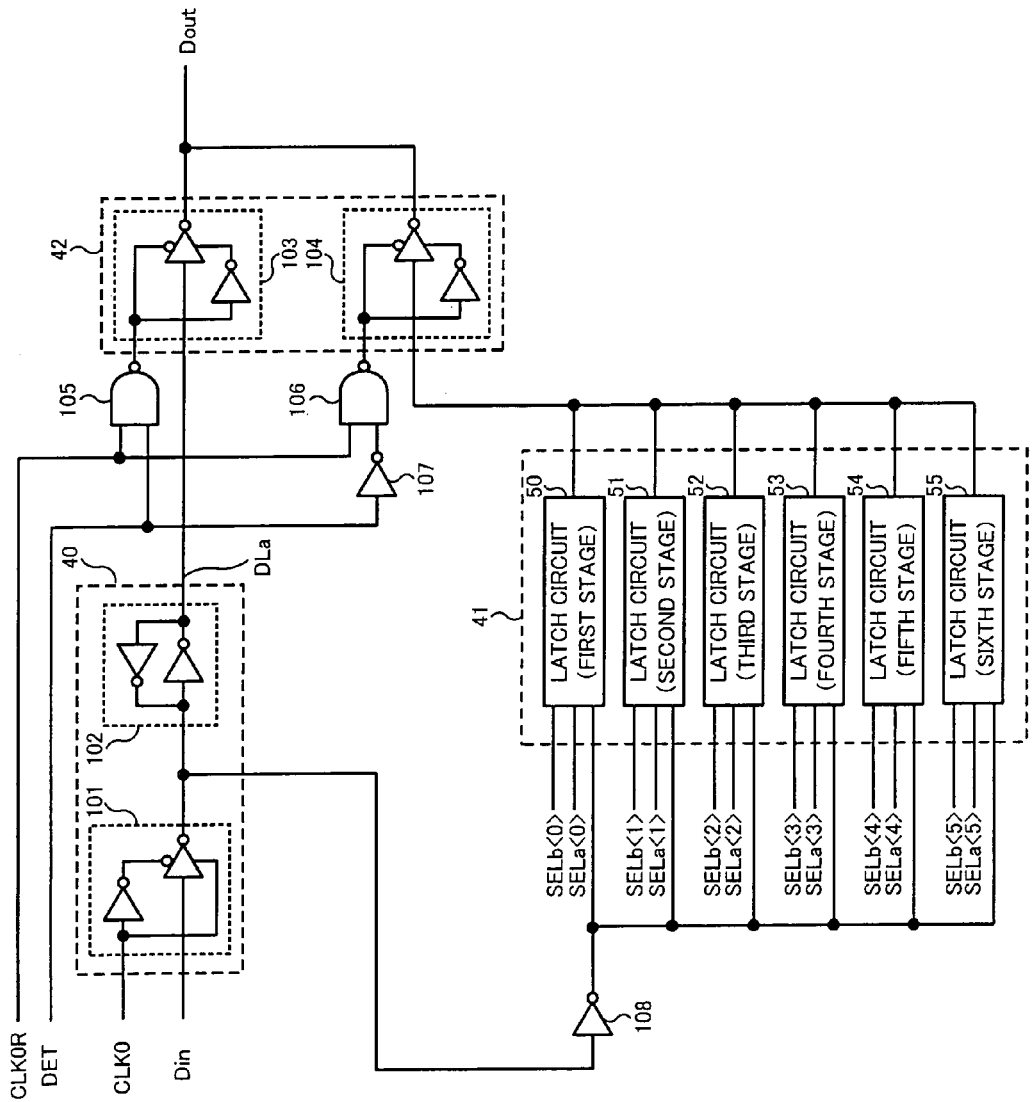
FIG. 3 is a diagram showing a specific circuit configuration of a FIFO buffer 30 of an output buffer circuit.
Figure 4:
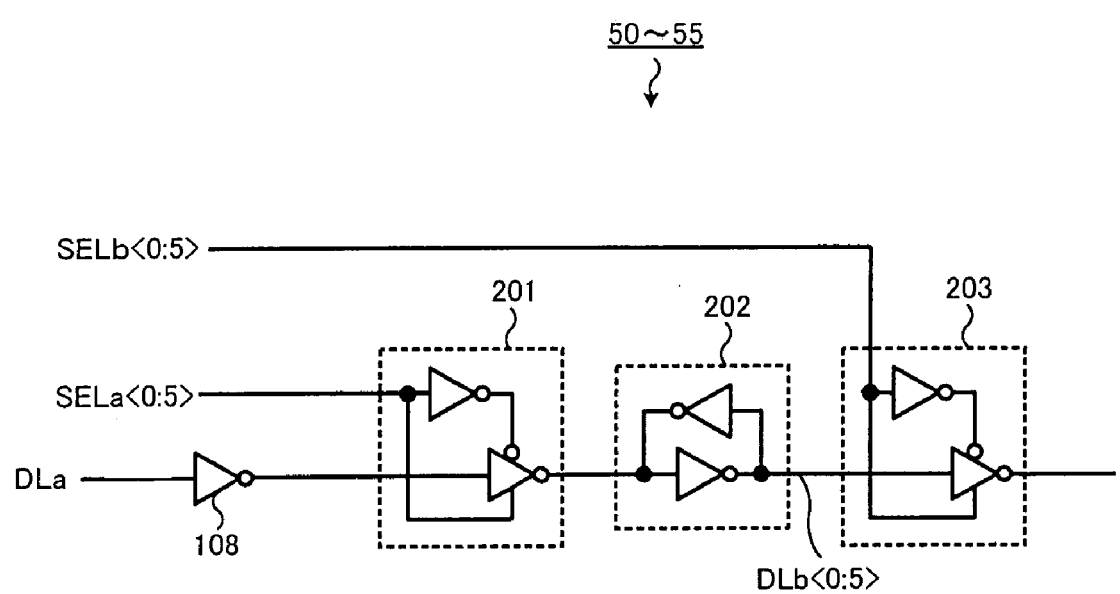
FIG. 4 is a diagram showing a circuit configuration of a latch circuit of each stage of a 6-bit latch circuit.

A specific circuit configuration of the FIFO buffer 30 will be described with reference to FIGS. 3 and 4. As shown in FIG. 3, the configuration of the FIFO buffer 30 is roughly divided into a 1-bit latch circuit 40, a 6-bit latch circuit 41 and a selector 42. The 1-bit latch circuit 40 latches 1 bit in a single transfer operation in which input data Din is transferred through the read/write RWB, and outputs the latched 1 bit at a predetermined timing. Meanwhile, the 6-bit latch circuit 41 latches a total of 6 bits in six transfer operations in each of which the input data Din are transferred, and outputs the latched 6 bits at predetermined timings in accordance with the latching sequence. The selector 42 selectively switches between paths of the 1-bit latch circuit 40 and the 6-bit latch circuit 41 in accordance with the determination signal DET from the tAA determination circuit 19, and an integrated output signal Dout is output.

The 1-bit latch circuit 40 includes an input-side switch unit 101 composed of two inverters, and a register unit 102 in which the two inverters are connected to each other at input and output sides thereof. A control signal CLK0 is applied to the switch unit 101. The switch unit 101 is controlled so as to pass the input data Din when the control signal CLK0 is high, and to block the input data Din when the control signal CLK0 is low. The control signal CLK0 is a pulse which is started at a predetermined timing after the issuance of the read command and is output every two cycles. The register unit 102 stores the input data Din of 1-bit passed through the switch unit 101, and thereafter even when the data Din is blocked by the switch unit 101, the register unit 102 continues to stably store data DLa which is at a high or low level.

The 6-bit latch circuit 41 has a configuration in which latch circuits 50 to 55 are connected in six stages. FIG. 4 shows a circuit configuration of each stage of the latch circuits 50 to 55. As shown in FIG. 4, each of the latch circuits 50 to 55 includes an input-side switch unit 201, a register unit 202 and an output-side switch unit 203. The switch units 201 and 203 have the same circuit configuration as the above-mentioned switch unit 101 and the register unit 202 has the same circuit configuration as the above-mentioned register unit 102. The input data Din is input to the input-side switch unit 201 of each stage through the switch unit 101 and an inverter 108. The output-side switch units 203 of respective stages are integrally connected to the selector 42.

In accordance with the sequence of the six-stage latch circuits 50 to 55, selection signals SELa<0> to SELa<5> are applied to the respective input-side switch units 201, and selection signals SELb<0> to SELb<5> are applied to the respective output-side switch units 203. For example, the input-side and output-side switch units 201 and 203 of the first-stage latch circuit 50 turn to passing states when the selection signals SELa<0> and SELb<0> are high, and turn to blocking states when the selection signals SELa<0> and SELb<0> are low. The latch circuits 51 to 55 of the second to sixth stages are also switched between the passing and blocking states under the same control.

The register units 202 of the six-stage latch circuits 50 to 55 stably store respective 1-bit data DLb<0> to DLb<5> each of which is passed through the switch unit 201. In this case, the selection signals SELa<0> to SELa<5> are sequentially set to high at different timings corresponding to the extraction timings of the input data Din, so that 6 bits in the six transfer operations can be latched in the latch circuits 50 to 55. Similarly, the selection signals SELb<0> to SELb<5> are sequentially set to high at different timings, so that the 6 bits can be output from the latch circuits 50 to 55 in accordance with the latching sequence.

In FIG. 3, the selector 42 is composed of two switch units 103 and 104. One switch unit 103 switches so as to pass or block the output signal from the 1-bit latch circuit 40 in response to a control signal output from a NAND circuit 105. The other switch unit 104 switches so as to pass or block the output signal from the 6-bit latch circuit 41 in response to a control signal output from a NAND circuit 106. Data through the switch unit 103 or data through the switch unit 104 is selectively output from the selector 42 and is transferred to the outside as output signal Dout.

The determination signal DET is input to one end of the NAND circuit 105 and a control signal CLK0R is input to the other end thereof. An inverted signal of the determination signal DET is input to one end of the NAND circuit 106 through an inverter 107 and the control signal CLK0R is input to the other end thereof. This control signal CLK0R is a pulse which synchronizes the timing of the transfer from the output buffer circuit 18 to be subsequently output every two cycles. Here, the switch units 103 and 104 have logics opposite to each other for the determination signal DET. That is, during a period in which the control signal CLK0R is low, the switch unit 103 is in the blocking state and the switch unit 104 is in the passing state when the determination signal DET is low, while the switch unit 103 is in the passing state and the switch unit 104 is in the blocking state when the determination signal DET is high. Thus, in the FIFO buffer 30, by controlling the selector 42, the path of the 1-bit latch circuit 40 is selected when the determination signal DET is high and the path of the 6-bit latch circuit 41 is selected when the determination signal DET is low.

Figure 5:
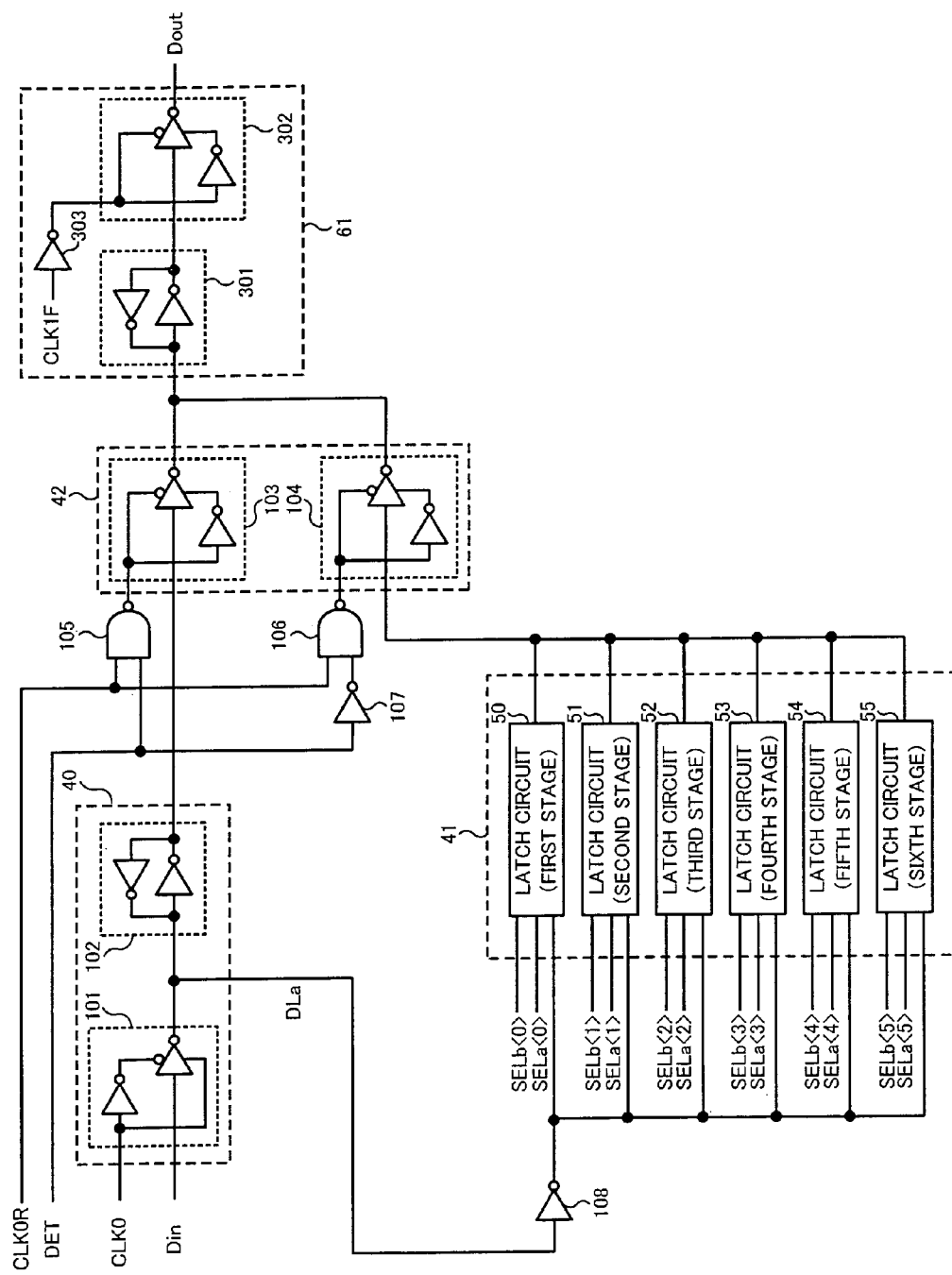
FIG. 5 is a diagram showing a specific circuit configuration of a FIFO buffer 31 of the output buffer circuit.
Figure 6:
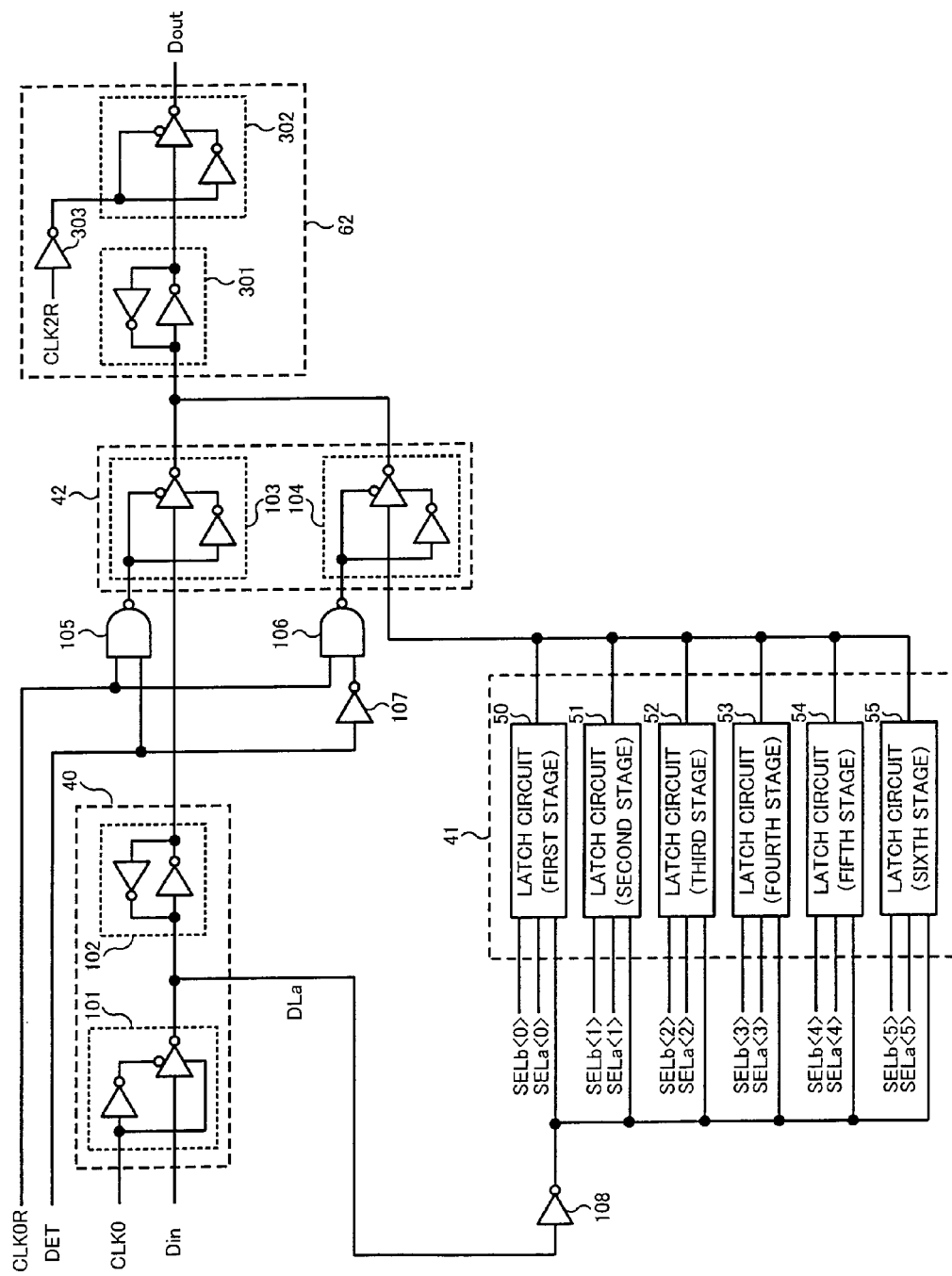
FIG. 6 is a diagram showing a specific circuit configuration of a FIFO buffer 32 of the output buffer circuit.
Figure 7:
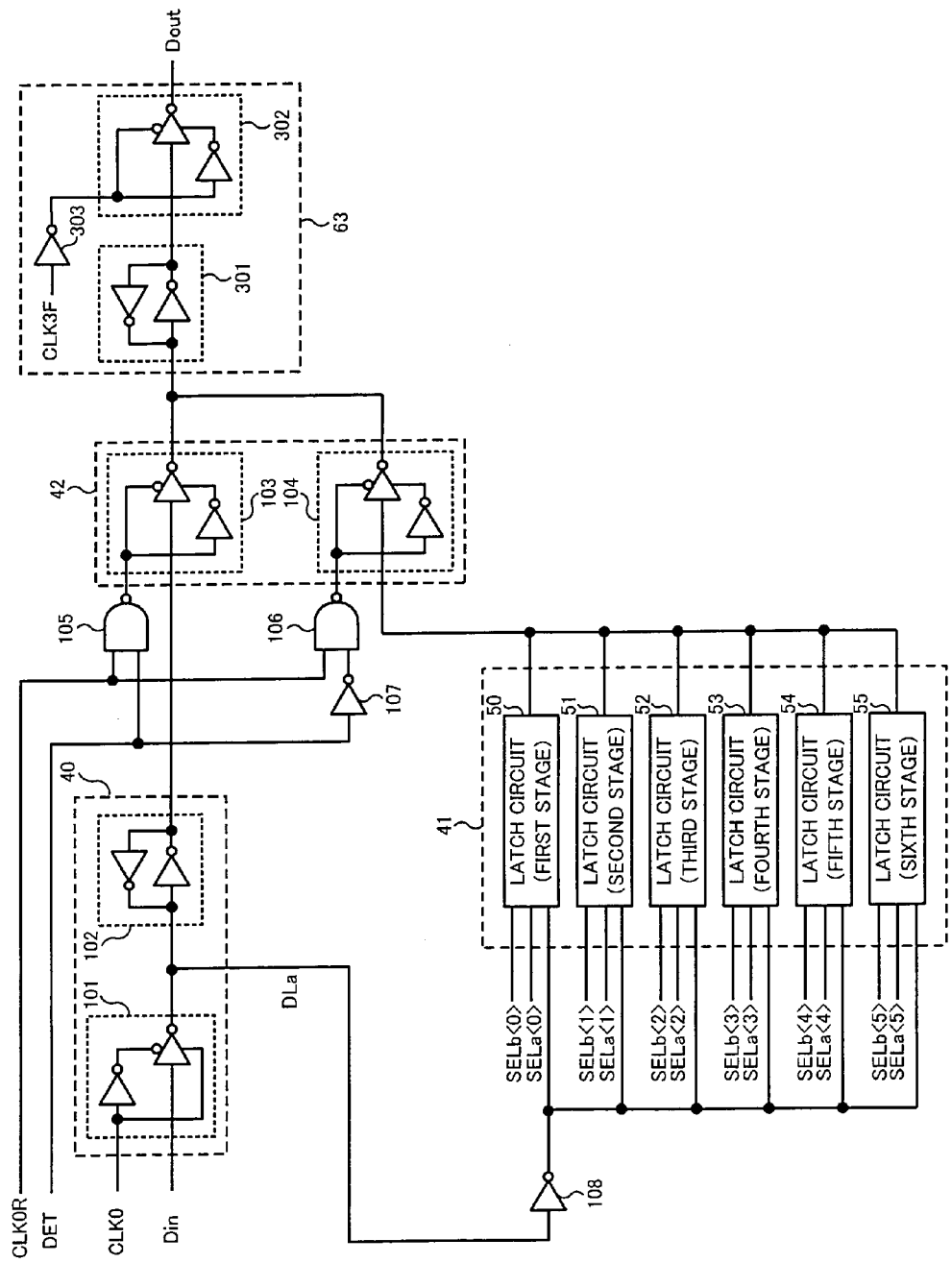
FIG. 7 is a diagram showing a specific circuit configuration of a FIFO buffer 33 of the output buffer circuit.

Specific circuit configurations of the other three FIFO buffers 31, 32, and 33 will be described with reference to FIGS. 5 to 7. The circuit configurations of the FIFO buffers 31 to 33 are substantially similar to that of the FIFO buffer 30 shown in FIG. 3. Thus, in the circuit configurations shown in FIGS. 5 to 7, the same elements as those in the FIFO buffer 30 of FIG. 3 are denoted by the same reference numerals, and the descriptions thereof will be omitted below. As shown in FIGS. 5 to 7, at the output side of the selector 42, the FIFO buffer 31 has an output-side circuit 61, the FIFO buffer 32 has an output-side circuit 62, and the FIFO buffer 33 has an output-side circuit 63.

Each of the output-side circuits 61 to 63 of the FIFO buffers 31 to 33 is composed of a register unit 301, a switch unit 302 and an inverter 303. Different control signals are applied to the three switch units 302 through the inverters 303. Specifically, a control signal CLK1F is applied to the output-side circuit 61 of FIG. 5, a control signal CLK2R is applied to the output-side circuit 62 of FIG. 6, and a control signal CLK3F is applied to the output-side circuit 63 of FIG. 7.

In each of the output-side circuits 61 to 63, the signal output from the selector 42 is input to the register unit 301 and low or high 1 bit is stably stored therein. The switch unit 302 turns to the passing state when the corresponding control signal CLK1F, CLK2R or CLK3F is high, and the switch unit 302 turns to the blocking state when the signal is low. Thus, by appropriately controlling timings at which the control signals CLK1F, CLK2R and CLK3F go high, it is possible to perform adjustment so that timings of the signals Dout of the four FIFO buffers 30 to 33 are slightly different from each other.

For example, the FIFO buffers 30 and 32 can be synchronized with the rising edge of the clock LCLK and the FIFO buffers 31 and 33 can be synchronized with the falling edge of the clock LCLK. In this case, all of the output signals Dout of the four FIFO buffers 30 to 33 can be output during a period corresponding to two cycles of the clock CLK. Operation waveforms in the operation of the FIFO buffers 30 to 33 are described below.

Next, referring back to FIG. 2, the output signals Dout of the FIFO buffers 30 to 33 are input to the selector 34. The selector 34 performs switching control between the integrated output signals Dout of the FIFO buffers 30 and 32 and the integrated output signals Dout of the FIFO buffers 31 and 33, based on a synchronous relationship with the clock CLK. Subsequently, a signal output from the selector 34 is transferred serially through the buffer 35 and is transmitted to the outside through the DQ terminal.

In addition, although only the single transfer path and the single output buffer circuit 18 are shown in the primary configuration of FIG. 2, it is necessary to provide a plurality of transfer paths and a plurality of output buffer circuits 18 in order to correspond to bit configuration of the DRAM. For example, on the assumption of a configuration of 16 I/O bits, 16 transfer paths and 16 output buffer circuits 18 need to be provided in the primary configuration of FIG. 2. When attention is paid to the 6-bit latch circuit 41, since one output buffer circuit 18 stores data of 24 bits (i.e., 6×4=24), data of a total of 384 bits (i.e., 24×16=384) are stored in the 16-bit (the number of I/O bits) configuration. The present invention is not only limited to the 16 bit (the number of I/O bits) configuration, but is also applicable to a DRAM which has a P-bit configuration of the number of I/O and is provided with P output buffer circuits 18.

In this embodiment, there are two operation modes of the output buffer circuit 18 as described above, one of which is an operation mode in which the data transfer path is switched to the side of the 1-bit latch circuits 40, and the other of which is an operation mode in which the data transfer path is switched to the side of the 6-bit latch circuits 41. The switching of the operation modes is controlled in accordance with a relationship in value between the access time tAA and a predetermined set time in the tAA determination circuit 19. Specifically, when the access time tAA does not reach the predetermined set time, the path of the 1-bit latch circuit 40 is set, and when the access time tAA exceeds the predetermined set time, the path of the 6-bit latch circuit 41 is set.

For example, if the access time tAA is specified by multiplying the period of the clock CLK by a CAS latency, the access time tAA is reduced for a high-speed clock CLK and the access time tAA is increased for a low-speed clock CLK. The following description is given of the difference in operations between a case in which the high-speed clock CLK is used and the path of the 1-bit latch circuits 40 is set and a case in which the low-speed clock CLK is used and the path of the 6-bit latch circuit 41 is set.

Figure 8:
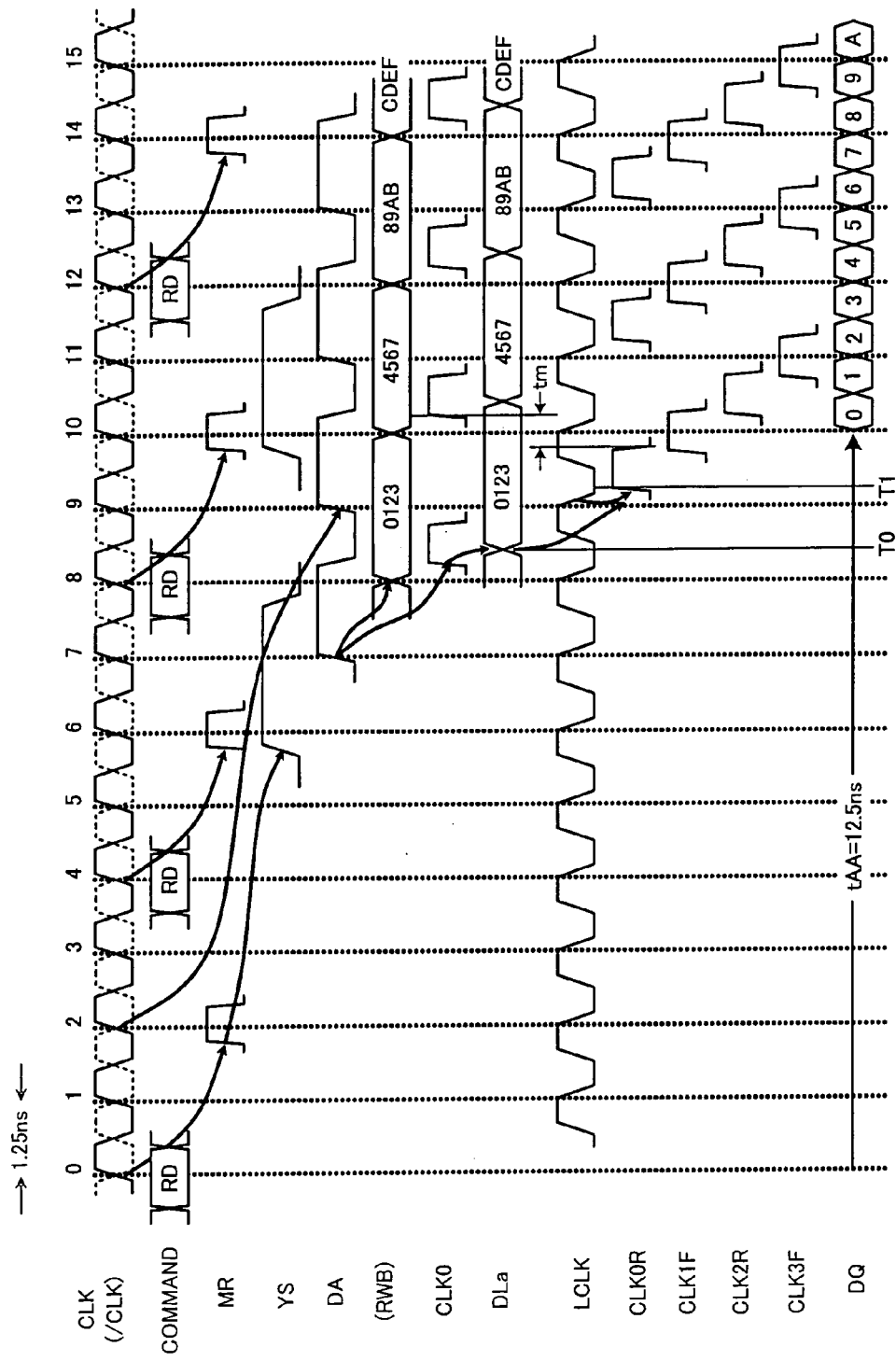
FIG. 8 is a diagram showing operation waveforms in which a path of a 1-bit latch circuit is set in the output buffer circuit.

FIG. 8 is a diagram showing operation waveforms in which a high-speed clock CLK having a period of 1.25 ns is used and the path of the 1-bit latch circuit 40 is set in the output buffer circuit 18. The cycles of the clock CLK are given numbers 0 to 15, which indicate the transition of the number of cycles. The burst read operation is assumed in which a read command RD is issued at cycle 0 as an external command, and thereafter the read commands RD are sequentially issued every four cycles. As shown in FIG. 8, two cycles after each read command RD is issued, a pulse of a command signal MR corresponding to a decoding result is output in response to the command RD. Further, a predetermined time is elapsed from the issuance of the command signal MR, selection signals YS for selecting bit lines corresponding to the designated address rise. Consequently, bit lines corresponding to eight consecutive addresses to be read are selected and data of corresponding memory cells is amplified by the eight sense amplifiers SA.

Subsequently, the 8-bit data is sent to the data amplifiers 20*a* and 20*b* and output signals DA thereof are output at cycle 7. The output signals DA are split into 4-bit data through the selector 21, the delay units 23 and the buffers 22. The first 4-bit data is transferred to the read/write bus RWB at cycle 8. Meanwhile, the subsequent 4-bit data is transferred to the read/write bus RWB at cycle 10.

In FIG. 8, respective 4-bit data are denoted such as 0123 and 4567. And, corresponding to the subsequent read commands RD, respective 4-bit data are denoted such as 89AB and CDEF.

Immediately after the timing at which the first data 0123 is transferred, a pulse of the control signal CLK0 rises. Consequently, each bit of the data 0123 is distributed to each of the FIFO buffers 30 to 33 and passes through the switch unit 101 of the corresponding 1-bit latch circuits 40. Here, the timing of the pulse of the control signal CLK0 depends on the operation speed of a DRAM core. Meanwhile, since the determination signal DET is high, each 1-bit latch circuits 40 latches 1 bit as the data DLa (i.e., each bit of the data 0123). In this case, a state in which the first data 0123 is latched at timing 0 is shown in FIG. 8.

Here, the timings of four control signals CLK0R, CLK1F, CLK2R and CLK3F which are applied to the four FIFO buffers 30 to 33 are shifted in this order by a half cycle of the clock CLK. That is, the pulse of the first clock CLK0R rises at timing T1, a pulse of the control signal CLK1F rises after a half cycle, a pulse of the control signal CLK2R rises after one cycle, and a pulse of the control signal CLK3F rises after one and a half cycle. Then, each bit of the 4-bit data 0123 is output in the order of the FIFO buffers 30, 31, 32 and 33 at the above-described timings.

Since control is performed for the subsequent 4-bit data 4567 using the same timings, the 8-bit data 01234567 to be transferred are serially transferred through the DQ terminal while being synchronized with the rising/falling edges of the clock CLK. Further, by repeating the same control for the subsequent read commands RD, data having a predetermined number of bits can be serially transferred through the DQ terminal repeatedly until the burst read is completed.

In FIG. 8, it is understood that the access time tAA of 10 periods is required from when the first read command RD is issued at cycle 0 until the first bit 0 is output from the DQ terminal at cycle 10. In this case, an expression tAA=10×1.25 ns=12.5 ns can be calculated. At timing when the access time tAA is reached, only the data 0123 is transferred to the output buffer circuit 18, but the transfer of the subsequent data 4567 is not started. That is, since the time until the second rising edge of the control signal CLK0 is set later relative to the access time tAA, a time tm from the falling edge of the control signal CLK0R to the rising edge of the control signal CLK0 is provided. The time tm is an operating margin for the 1-bit latch circuit 40. In such a case, it is sufficient for each of the FIFO buffers 30 to 33 to store one bit, so the path of the 1-bit latch circuit 40 is set.

Figure 9:
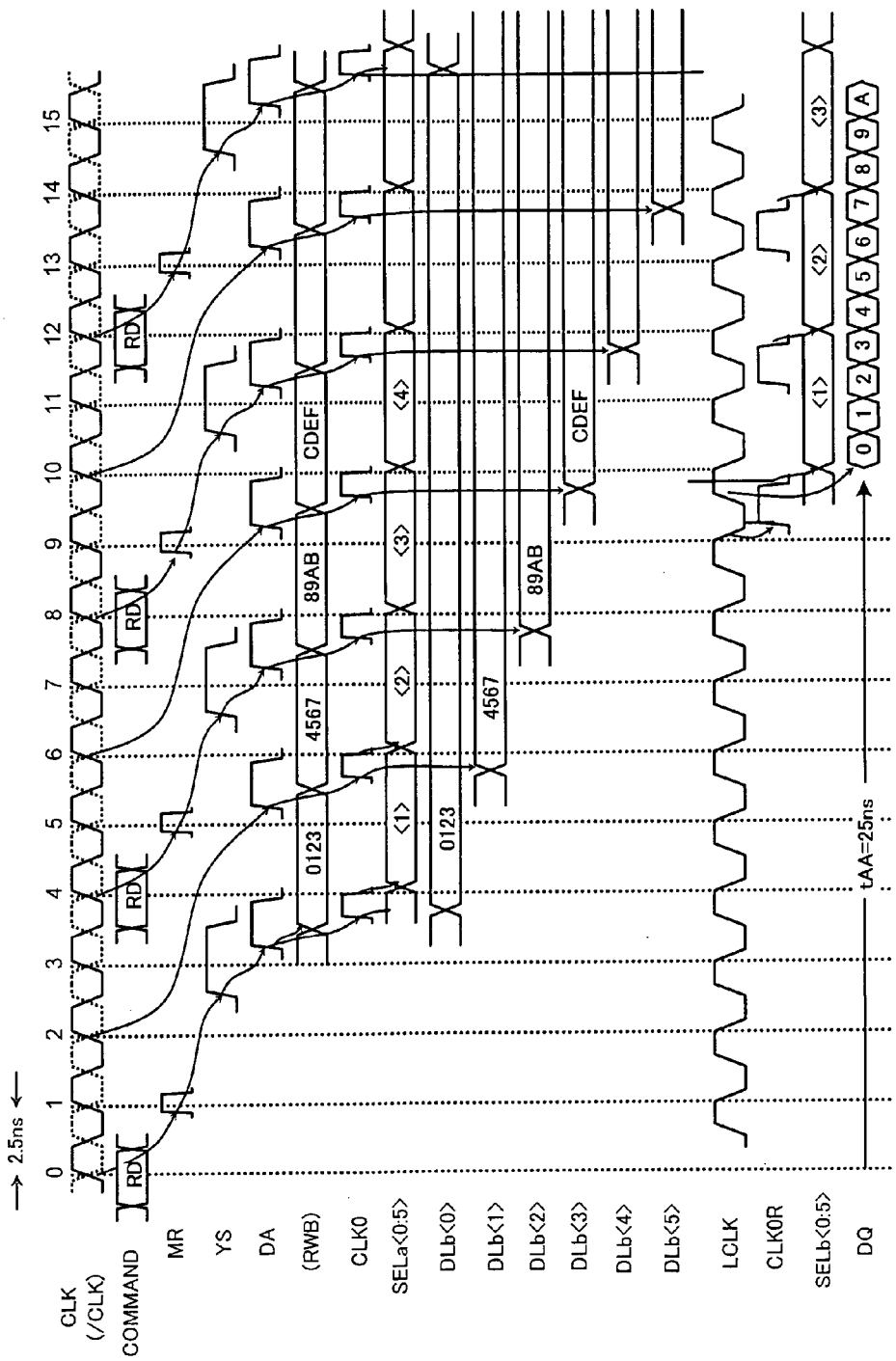
FIG. 9 is a diagram showing operation waveforms in which a path of the 6-bit latch circuit is set in the output buffer circuit.

FIG. 9 is a diagram showing operation waveforms in which a lower-speed clock CLK having a period of 2.5 ns being twice the above-mentioned period is used and the path of the 6-bit latch circuit 41 is set in the output buffer circuit 18. In FIG. 9, since each cycle of the clock CLK is expressed using the same width as that in FIG. 8, the actual time axis is twice that in FIG. 8. In this case, the burst read operation in which the first read command RD is issued and thereafter the read commands RD are sequentially issued every four cycles is the same as in FIG. 8.

As shown in FIG. 9, regarding the timings at which the selection signals YS of the column decoder 13 and the output signals DA of the data amplifiers 20*a* and 20*b* are output and the transfer timing of the first 4-bit data on the read/write bus RWB, about the same amounts of time are required as in the case of FIG. 8, but the number of cycles is reduced to half. As can be understood from FIG. 9, at the timing when the second read command RD is issued, the transfer operation of the first data 0123 to the output buffer circuit 18 through the read/write bus RWB has not been completed. On the other hand, the access time tAA is calculated by tAA=10×2.5 ns=25 ns, but is different from that in FIG. 8. That is, at least four rising edges of the signal CLK0 precede the timing when the access time tAA is reached. In such a case, if one bit is stored in each of the FIFO buffers 30 to 33, the process is not finished in time, and therefore the path of the 6-bit latch circuit 41 is set.

In FIG. 9, the control signal CLK0R rises in synchronization with the transfer timing of the 4-bit data and each bit thereof is distributed to each of the FIFO buffers 30 to 33. The 6-bit latch circuit 41 in each of the FIFO buffers 30 to 33 is controlled so that the six-stage latch circuits 50 to 55 are sequentially turned to the passing states. Thus, the input-side selection signals SELa<0:5> sequentially turn to high while being switched every two cycles.

In the four FIFO buffers 30 to 33, each bit of the first data 0123 is latched in the first-stage latch circuit 50 as the data DLb<0>, and two cycles thereafter each bit of the second data 4567 is latched in the second-stage latch circuit 51 as the data DLb<1>. Subsequently, data is similarly latched in the latch circuits 50 to 55 every two cycles.

After cycle 9, the control signal CLK0R and the output-side selection signals SELb<0:5> are output. In this case, the selection signals SELb<0:5> are switched every two cycles, and in the four FIFO buffers 30 to 33, the latched data DLb<0> to DLb<5> in the latch circuits 50 to 55 are output in accordance with the latching sequence. Each of four-bit data is output as the output signal Dout through the selector 42 of the FIFO buffers 30 to 33. By performing the same control repeatedly for each read command RD, data to be transferred is serially transferred to the outside through the DQ terminal while being synchronized with the rising/falling edges of the clock CLK.

Figure 10:
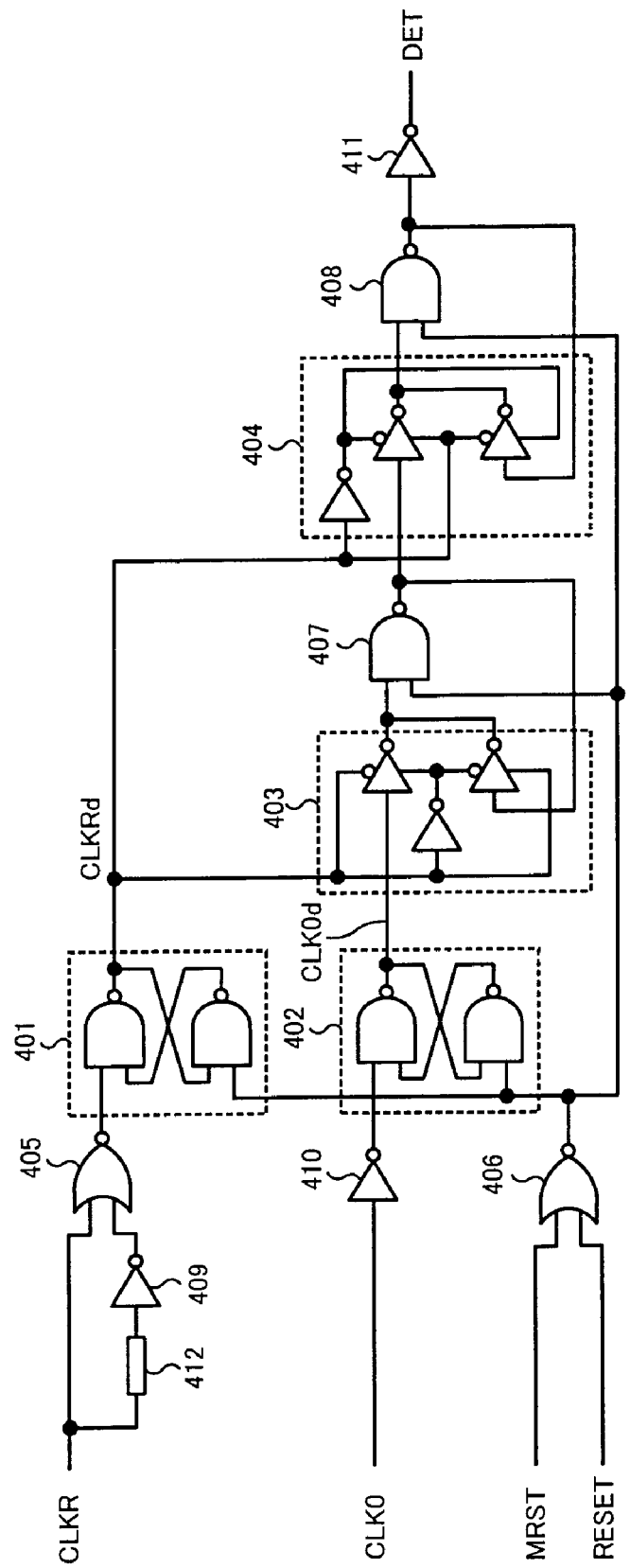
FIG. 10 is a diagram showing a specific circuit configuration of a tAA determination circuit.

Next, configuration and operation of the tAA determination circuit 19 and conditions of a set value used as a comparison reference for the determination signal DET. FIG. 10 shows a specific circuit configuration of the tAA determination circuit 19. As shown in FIG. 10, the tAA determination circuit 19 includes RS latches 401 and 402, switch units 403 and 404, NOR circuits 405 and 406, NAND circuits 407 and 408, inverters 409, 410 and 411, and a delay unit 412.

Two RS latches 401 and 402 are reset in response to an output of the NOR circuit 406 to which a later described MRST signal and a RESET signal are input. Thus, if the MRST signal or the RESET signal goes high, the RS latches 401 and 402 are reset. The RS latch 401 is set in response to the control signal CLKR and an output of the NOR circuit 405 to which the control signal CLKR and an inverted signal thereof through the delay unit 412 and the inverter 409 are input. Thus, the NOR circuit 405 outputs a pulse which goes low at the falling edge of the pulse of the control signal CLKR, and thereby the RS latch 401 is set.

The width of the set pulse of the RS latch 401 can be adjusted in accordance with a delay time of the delay unit 412. The RS latch 402 is set in response to the control signal CLK0 input through the inverter 410. Thus, when the pulse of the control signal CLK0 is output, the RS latch 402 is set.

When a latch signal CLKRd output from the RS latch 401 is low, the front switch unit 403 composed of three inverters passes a latch signal CLK0d output from the RS latch 402. On the other hand, when the latch signal CLKRd is high, the switch unit 403 blocks the latch signal CLK0d and the state at the timing of the immediately preceding passing is stably maintained by the connection of input and output sides of the NOR circuit 407.

When the latch signal CLKRd is high, the subsequent-stage switch unit 404 composed of three inverters passes an output of the NOR circuit 407. On the other hand, when the latch signal CLKRd is low, the switch unit 404 blocks the output of the NOR circuit 407 and the state at the timing of the immediately preceding passing is stably maintained by the connection of input and output sides of the rear NOR circuit 408. The output of the NOR circuit 408 is output through the inverter 411 as the determination signal DET.

The following description is given of a difference in operations of the tAA determination circuit 19 between a case in which the path of the 1-bit latch circuit 40 is set using a high-speed clock CLK and a case in which the path of the 6-bit latch circuit 41 is set using a low-speed clock CLK.

Figure 11:
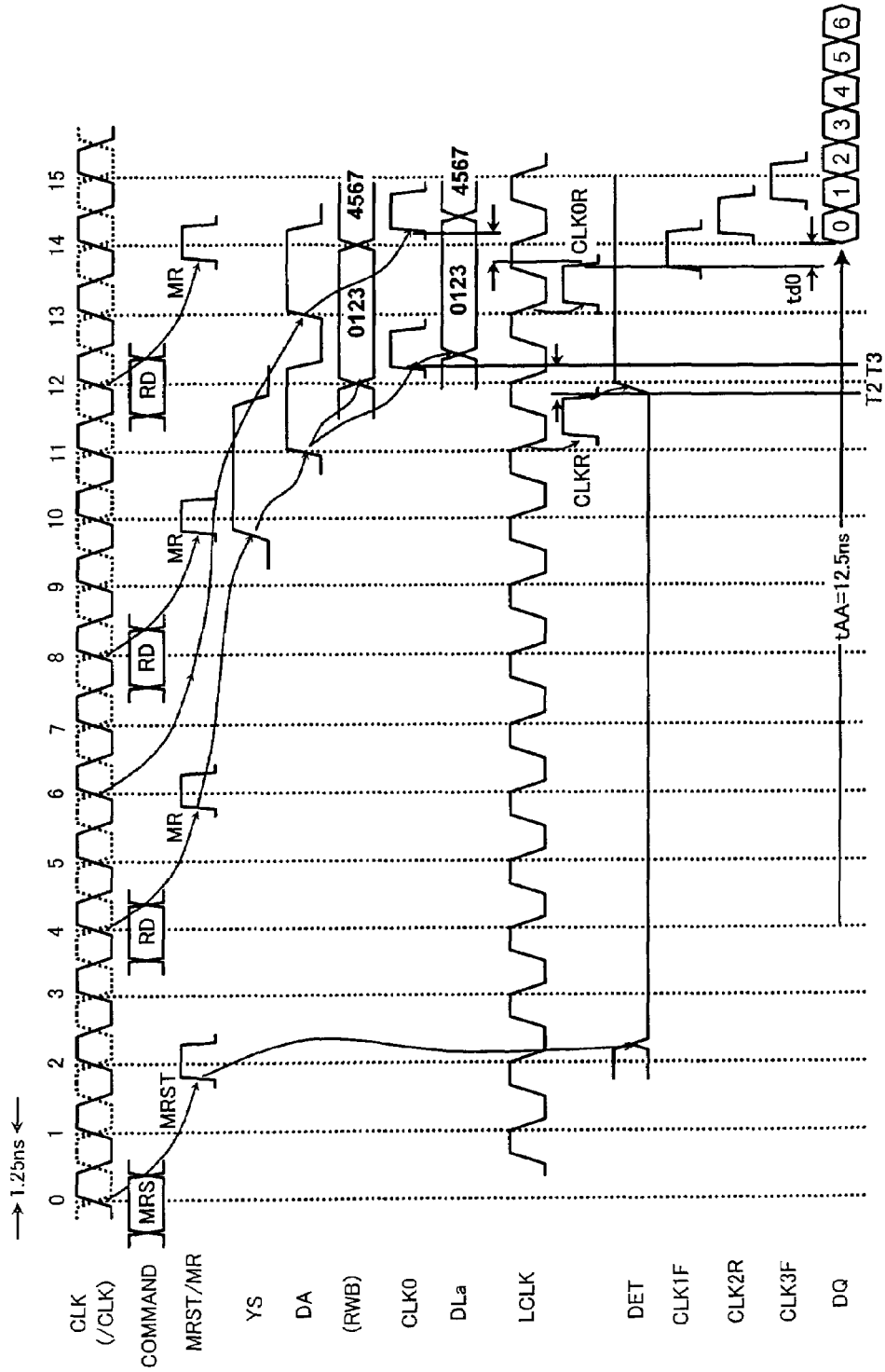
FIG. 11 is a diagram showing operation waveforms of the tAA determination circuit in which a high-speed clock is used.

FIG. 11 is a diagram showing operation waveforms of the tAA determination circuit 19 in which a high-speed clock CLK having a period of 1.25 ns is used, as in FIG. 8. In this embodiment, when an MRS command which is a set command for a mode register (not shown) used for initializing the DRAM is issued, the operation of the tAA determination circuit 19 is performed. In FIG. 11, the set command MRS is issued at cycle 0, and after two cycles, a pulse of the MRST signal is output corresponding to the decoding result. Subsequently, the read command RD is issued at cycle 4, and the subsequent burst-read operation is performed as in FIG. 8.

When the MRST signal goes high in response to the issuance of the set command MRS, the RS latches 401 and 402 of FIG. 10 are reset and outputs of the two NAND circuits 407 and 408, to each of which the MRST signal is applied at one end, go high, as described above. Thereafter, during the period when the control signal CLKR is held low, the determination signal DET is held low. Further, during this period, the front switch unit 403 is in the passing state, the rear switch unit 404 is in the blocking state, and the output of the NAND circuit 407 is low.

Here, it is assumed that the control signal CLKR rises two cycles prior to the control signal CLK0R applied to the output buffer circuit 18. Thus, as shown in FIG. 11, a pulse of the control signal CLKR is output during cycle 11 prior to a pulse of the control signal CLK0R. In FIG. 10, when the latch signal CLKRd goes high at the falling edge of the control signal CLKR, the front switch unit 403 turns to the blocking state and the rear switch unit 404 turns to the passing state. Then, two NAND circuits 407 and 408 are connected and the output of the rear NAND circuit 408 changes from high to low, so that the determination signal DET changes from low to high at timing T2.

Meanwhile, the control signal CLK0 is a pulse synchronizing with the transfer timing of the read/write bus RWB. In the case of FIG. 11, since the control signal CLK0 rises for the first time at timing T3 when the determination signal DET is already high, a change in the control signal CLK0 is blocked by the switch unit 402. Thus, the determination signal DET is held high until the RS latch 401 is reset subsequently. Accordingly, the path of the 1-bit latch circuit 40 is set in the output buffer circuit 18. In this manner, by determining that the control signal CLKR is issued prior to the control signal CLK0, an appropriate transfer operation can be performed using the path of the 1-bit latch circuit 40 corresponding to the access time tAA of 12.5 ns in FIG. 11.

Figure 12:
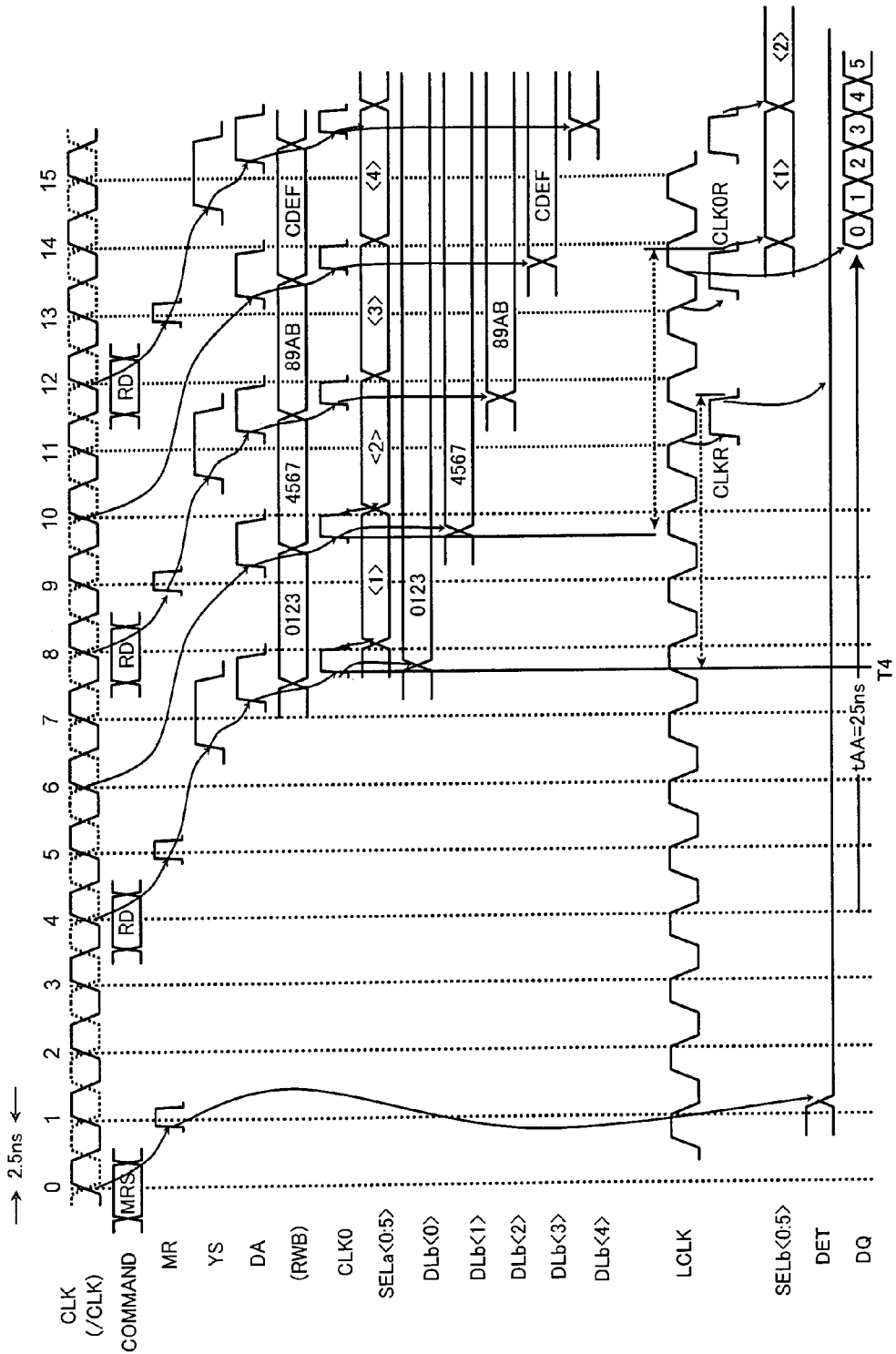
FIG. 12 is a diagram showing operation waveforms of the tAA determination circuit in which a low-speed clock is used.

FIG. 12 is a diagram showing operation waveforms of the tAA determination circuit 19 in which a low-speed clock CLK having a period of 2.5 ns is used, as in FIG. 9. In the same manner as in FIG. 11, the RS latches 401 and 402 of FIG. 12 are reset in response to the MRST signal corresponding to the set command MRS. In FIG. 12, however, the timings of a pulse of the control signal CLKR and a pulse of the control signal CLK0 are different from those in FIG. 11. That is, the control signal CLKR rises during cycle 11, two cycles prior to the control signal CLK0R, as in FIG. 11. On the other hand, regarding the control signal CLK0 which is determined by the transfer timing of the read/write bus RWB, its cycles are preceded and the number thereof is reduced to half, because the time axis is extended by a factor of 2 on the assumption of the same time range as that in FIG. 11.

Therefore, the pulse of the control signal CLK0 is output at timing 4 prior to the control signal CLKR, as opposed to the case in FIG. 11. By this, the RS latch 402 of FIG. 10 is set and the latch signal CLKRd goes high so as to pass through the front switch unit 403 in the passing state, and thereby the output of the NOR circuit 407 changes from low to high. Thereafter, the latch signal CLKRd goes high at the falling edge of the control signal CLKR, so that the front switch unit 403 turns to the blocking state and the rear switch unit 404 turns to the passing state. Consequently, since two NAND circuits 407 and 408 are connected and the output of the rear NAND circuit 408 goes high, the determination signal DET is held low.

In such a case where the pulse of the control signal CLK0 precedes the subsequent change in the pulse of the control signal CLKR, the determination signal DET does not change to high as shown in FIG. 11. Accordingly, the path of the 6-bit latch circuit 41 is set in the output buffer circuit 18. That is, by determining that the control signal CLK0 precedes the control signal CLKR, an appropriate transfer operation can be performed using the path of the 6-bit latch circuits 41 corresponding to the access time tAA of 25 ns in FIG. 12.

Next, switching conditions of the tAA determination circuit 19 will be described. In FIGS. 11 and 12, based on a starting point at which the first read command RD is issued, a time from the starting point to the rising edge of the control signal CLK0 is denoted by t1, and a time from the starting point to the falling edge of the control signal CLKR is denoted by t2. In this case, the tAA determination circuit 19 determines the relationship between the amounts of time t1 and time t2. In general, time t1 is determined by an actual value of the access operation of the DRAM core and is, for example, assumed to be expressed by:

$$t1=10.9 \text{ ns} \quad (1)$$

And time t2 satisfies the following relationship using a period tCK of the clock CLK, a CAS latency CL, and a delay time td0 of the output buffer circuit 18:

$$t2=(CL-2) \times tCK - td0 \quad (2)$$

In addition, the delay time td0 is about 0.5 ns. In this case, conditions for switching between the paths of the 1-bit latch circuits 40 and the 6-bit latch circuits 41 are:

(a) in a case of t1≧t2, the path of 1-bit latch circuit 40 is set; and (b) in a case of t1<t2, the path of the 6-bit latch circuit 41 is set.

Therefore, application of equations (1) and (2) to the condition (a) yields:

$$tCL \leq 11.4/(CL-2) \quad (3)$$

On the other hand, application of equations (1) and (2) to the condition (b) yields:

$$tCL > 11.4/(CL-2) \quad (4)$$

For example, in a case of CL=10, tCK≦1.43 ns is satisfied for the condition (a) and tCK>1.43 ns is satisfied for the condition (b).

As described above, according to this embodiment, the 1-bit latch circuit 40 and the 6-bit latch circuit 41 are provided in parallel in each of the FIFO buffers 30 to 33 and can be selectively used in accordance with the determination signal DET of the tAA determination circuit 19. When the frequency of the clock CLK fluctuates, the access time tAA associated with the number of cycles changes, but the operation speed of the DRAM core does not change greatly. Thus, when using the high-speed clock CLK, the access time tAA is reduced, so latching of a large number of is not required. In contrast, when using the low-speed CLK, the access time tAA is increased, so latching of a larger number of bits is required. In the configuration of this embodiment, the 1-bit latch circuit 40 is used to latch a minimum amount of data using the high-speed clock CLK and the 6-bit latch circuit 41 is used to latch a sufficient amount of data using the low-speed clock CLK. Such a configuration enables an appropriate adaptation for changes in the operating conditions. Thus, when using the high-speed clock CLK, the shortest path can be formed to allow an increase in the operation speed, and the scale of the circuit used in the transfer operation can be reduced to allow a reduction in the operating current during the access. On the other hand, when using the low-speed clock CLK, the latch circuits reliably operate even if the amount of data to be stored increases due to changes in the operating conditions or the like, and it is possible to prevent malfunction.

Although features of the present invention have been specifically described above based on this embodiment, the present invention is not limited to this embodiment described above, and the various changes and modifications can be made without departing from the sprit and scope of the present invention. For example, although the output buffer circuit 18 of this embodiment has a configuration in which the 1-bit latch circuit 40 and the 6-bit latch circuit 41 are provided in parallel to be selectively switched, it may have a wider configuration in which an M-bit latch circuit and an N-bit latch circuit (N>M) are provided in parallel to be selectively switched. In this case, it is desirable to select optimum M and N, considering various operating conditions of semiconductor storage devices. For example, if a 2-bit latch circuit which replaces the 1-bit latch circuit 40 and the 6-bit latch circuit 41 are provided in parallel, equations (1) to (4) noted above can be expressed as (1)' to (4)' below:

$$t1=10.9 \text{ ns}+2 \times tCK \quad (1)'$$

$$t2=(CL-2) \times tCK - td0 \quad (2)'$$

$$tCL \leq 11.4/(CL-4) \quad (3)'$$

$$tCL > 11.4/(CL-4) \quad (4)'$$

Although a case in which the number of prefetched bits is 8 and the number of bits transferred in parallel through the read/write bus RWB is 4 has been described in this embodiment, these numbers of bits can be appropriately changed corresponding to design requirements. Further, specific circuit configurations of the output buffer circuit 18 and the tAA determination circuit 19 can be realized by any configurations capable of achieving the same function.

The present invention is not limited to the above described embodiments, and various variations and modifications may be possible without departing from the scope of the present invention.

This application is based on the Japanese Patent application No. 2005-271197 filed on Sep. 16, 2005, entire content of which is expressly incorporated by reference herein.

What is claimed is:

1. A semiconductor storage device comprising:
    a transfer control circuit for prefetching data of a predetermined number of bits stored in a memory array in response to a read command, and transferring L bits which is a transfer unit of said prefetched data in parallel to an internal bus in synchronization with an internal clock; and
    an output buffer circuit which includes L FIFO buffers each for latching each bit of said L bits input from said internal bus and extracts stored data from each of said L FIFO buffers in accordance with an input sequence in synchronization with an external clock so as to transfer said data serially to outside,
    wherein each of said L FIFO buffers includes an M-bit latch circuit for latching M bits of data input sequentially and an N-bit latch circuit for latching N (N>M) bits of data input sequentially, and a path of said M-bit latch circuit and a path of said N-bit latch circuit can be selectively switched.

2. A semiconductor storage device according to claim 1, wherein said M is 1 and said M-bit latch circuit is a 1-bit latch circuit for latching 1 bit of data input sequentially.

3. A semiconductor storage device according to claim 1, further comprising a determination circuit for generating a determination signal having a binary value based on an access time corresponding to said read command,
wherein said output buffer circuit switches paths of said M-bit latch circuit and said N-bit latch circuit said in response to said determination signal.

4. A semiconductor storage device according to claim 3, wherein said determination signal indicates a relationship in value between said access time and a predetermined set value, and said output buffer circuit switches in response to said determination signal so that the path of said M-bit latch circuit is set when said access time does not reach said set value and the path of said N-bit latch circuit is set when said access time exceeds said set value.

5. A semiconductor storage device according to claim 3, wherein said access time is specified as a time obtained by multiplying a period of said external clock and a CAS latency.

6. A semiconductor storage device according to claim 3, wherein said determination circuit generates said determination signal based on said access time corresponding to a first read command after an issuance of a set command for a mode register.

7. A semiconductor storage device according to claim 1 or 2, wherein said transfer control circuit prefetches data of said predetermined number of bits corresponding to a predetermined number of consecutive addresses for a burst read operation.

8. A semiconductor storage device according to claim 7, wherein said transfer control circuit prefetches data of 2L bits corresponding to 2L consecutive addresses, and said L bits into which said 2L bits is divided is transferred in parallel to said internal bus.

9. A semiconductor storage device according to claim 8, wherein said L is 4 and said transfer control circuit includes four said FIFO buffers.

10. A semiconductor storage device according to claim 1 or 2, wherein said N is 6 and said N-bit latch circuit is a 6-bit latch circuit for latching 6 bits of data input sequentially.

11. A semiconductor storage device according to claim 1 or 2, wherein said output buffer circuit performs said serial transfer in synchronization with a rising edge and a falling edge of said external clock.

12. A semiconductor storage device according to claim 1 or 2, wherein a configuration of P bits as I/O bits is employed and P said transfer control circuits and P said output buffer circuits are arranged in parallel.

* * * * *